(12) United States Patent
Ondelj

(10) Patent No.: US 8,294,037 B2
(45) Date of Patent: Oct. 23, 2012

(54) METHOD FOR ARRANGING A COMPONENT ON A CIRCUIT BOARD

(75) Inventor: Dario Ondelj, Lund (SE)

(73) Assignee: Sony Ericsson Mobile Communications AB, Lund (SE)

( * ) Notice: Subject to any disclaimer, the term of this patent is extended or adjusted under 35 U.S.C. 154(b) by 286 days.

(21) Appl. No.: 12/505,892

(22) Filed: Jul. 20, 2009

(65) Prior Publication Data

US 2011/0011635 A1 Jan. 20, 2011

(51) Int. Cl.
*H05K 1/16* (2006.01)
*H05K 7/00* (2006.01)
*H01R 13/73* (2006.01)

(52) U.S. Cl. .......... 174/260; 361/760; 361/737; 439/544

(58) Field of Classification Search .................. None
See application file for complete search history.

(56) References Cited

U.S. PATENT DOCUMENTS

| | | | | |
|---|---|---|---|---|
| 5,611,013 | A * | 3/1997 | Curzio | 385/89 |
| 7,341,470 | B2 * | 3/2008 | Suzuki et al. | 439/260 |
| 7,477,521 | B2 * | 1/2009 | Charny et al. | 361/749 |
| 7,922,526 | B2 * | 4/2011 | Okada et al. | 439/544 |
| 2008/0285242 | A1 | 11/2008 | Charny et al. | |
| 2009/0218120 | A1 * | 9/2009 | Oooka | 174/260 |

FOREIGN PATENT DOCUMENTS

| | | |
|---|---|---|
| CA | 2209981 | 1/1999 |
| DE | 102008002546 | 12/1999 |

OTHER PUBLICATIONS

International Search Report from International Application No. PCT/EP2010/000310, mailed Apr. 23, 2010.

* cited by examiner

*Primary Examiner* — Boris Chervinsky
(74) *Attorney, Agent, or Firm* — Renner, Otto, Boisselle & Sklar LLP

(57) ABSTRACT

A method for arranging a component on a circuit board, a circuit board, and a mobile device comprising a circuit board are described.

16 Claims, 3 Drawing Sheets

METHOD FOR ARRANGING A COMPONENT ON A CIRCUIT BOARD

BACKGROUND OF THE INVENTION

The present invention relates to a method for arranging a component on a circuit board, a circuit board, and a mobile device.

BRIEF SUMMARY OF THE INVENTION

According to an embodiment of the present invention, a method for arranging a component on a circuit board is provided. According to the method, at least one cutout is provided in the circuit board such that a component area of the circuit board is physically separated from a remaining area of the circuit board except along either one straight borderline or several straight borderlines. The one straight borderline delimits the component area from the remaining area of the circuit board. The several straight borderlines delimit the component area from the remaining area of the circuit board and are arranged on a common straight line, that means that the several straight borderlines are all lying on one common straight line. The component is mounted on the component area of the circuit board such that the component is placed on the component area.

The component area may have substantially the same size as a footprint of the component or may have a slightly larger size than the footprint of the component. A slightly larger size means that the component area extends beyond the footprint of the component in the direction of the common straight line and/or in the direction of the one or several cutouts for e.g. a few millimeters, preferably 1-5 mm.

The component may comprise an electromechanical component, e.g. a connector, a switch, a connector plug, or a connector socket. Preferably the component may comprise a USB connector.

The circuit board may be comprised in a mobile device and the component may be mechanically accessible from an outside of the mobile device when the component is mounted on the component area of the circuit board.

Especially in the area of mobile devices, electromechanical components, e.g. a connector, like a USB connector, or a switch, are mounted on a circuit board of the mobile device in such a way that these electromechanical components are accessible through an opening in a housing of the mobile device from an outside of the mobile device. When being accessed, a physical force may be applied to the component, e.g. when a switch is actuated or a USB plug is plugged into a USB socket mounted on the circuit board. Commonly, the components of a mobile device are mounted on the circuit board by soldering the component to soldering points of the circuit board. When the physical force is applied to the component, this may generate a momentum or a force directly on the soldering points. This may lead to a damage of the soldering point and may lead to a malfunction of the component. Therefore, according to the present invention, a cutout is provided in the circuit board such that a component area of the circuit board is physically separated from a remaining area of the circuit board except along a straight borderline which delimits the component area from the remaining area of the circuit board. With a component arranged in such a way on the component area of the circuit board, the component can elastically swing around an axis defined by the straight borderline as the component area is physically connected to the remaining area of the circuit board only along the straight borderline and the circuit board may provide flexibility around this axis. Therefore, a stress from the soldering points can be removed when the component is swinging together with the component area when a force or a momentum is applied to the component.

According to an embodiment the circuit board comprises a multi-layer circuit board. The multi-layer circuit board comprises several conductive layers, made e.g. of copper or copper foil, and non-conductive substrate layers, made e.g. of an epoxy material. Within the component area unnecessary or unused conductive layers are removed such that the number of conductive layers in the component area may be lower than the number of conductive layers in the remaining area. Thus, an elasticity of the circuit board can be increased and the risk of a circuit board break can be reduced when a force is applied to the component or the component area.

According to another embodiment of the present invention, a circuit board is provided. The circuit board comprises a component area on which a component is to be mounted, and at least one cutout in the circuit board such that the component area of the circuit board is physically separated from a remaining area of the circuit board except along either one straight borderline or several straight borderlines. The one straight borderline delimits the component area from the remaining area of the circuit board. The several straight borderlines delimit the component area from the remaining area of the circuit board and are arranged on a common straight line.

According to an embodiment, the component area has substantially the same size as a footprint of the component, or the component area has substantially a slightly larger size than a footprint of the component.

The component may comprise an electromechanical component, e.g. a connector, a switch, a connector plug, a connector socket, or a USB connector. The circuit board may be a circuit board of a mobile device, wherein the component is mechanically accessible from an outside of the mobile device.

A circuit board according to another embodiment of the present invention comprises a connector area, a first cutout, and a second cutout. The connector area, on which a connector is to be mounted, has a substantially rectangular shape with a first side, a second side being substantially in parallel to the first side, a third side, and a fourth side being substantially in parallel to the third side, wherein the first and the second sides are substantially perpendicular to the third and the fourth sides. The first side of the connector area is aligned to an edge of the circuit board. The first cutout in the circuit board is arranged along the third side of the connector area and the second cutout in the circuit board is arranged along the fourth side of the connector area. Thus, the connector area is connected to a remaining area of the circuit board only along the second side.

The circuit board may be comprised in a mobile device, wherein the connector is mechanically accessible from an outside of the mobile device, and an access opening of the connector, e.g. an insertion opening of a connector socket, is arranged at and along the first side.

When a force is applied to the connector in a direction perpendicular to the plane of the circuit board, the connector can swing together with the connector area around an axis defined along the second side. Therefore, as discussed above, a stress on connector soldering points connecting the connector to the circuit board can be avoided.

According to an embodiment the circuit board comprises a multi-layer circuit board. The multi-layer circuit board comprises several conductive layers, made e.g. of copper or copper foil, and non-conductive substrate layers, made e.g. of an epoxy material. Within the connector area unnecessary or unused conductive layers are removed or omitted such that the number of conductive layers in the connector area may be lower than the number of conductive layers in the remaining area. Thus, an elasticity of the circuit board can be increased and the risk of a circuit board break can be reduced when a force is applied to the connector or the connector area.

According to another embodiment, a mobile device with a circuit board is provided. The circuit board comprises a component area on which a component is to be mounted, and at least one cutout in the circuit board such that the component area of the circuit board is physically separated from a remaining area of the circuit board expect along either one straight borderline delimiting the component area and the remaining area of the circuit board, or several straight borderlines delimiting the component area and the remaining area of the circuit board. The several borderlines are arranged on a common straight line.

According to another embodiment, a mobile device is provided. A circuit board of the mobile device comprises a connector area on which a connector is to be mounted, a first cutout in the circuit board, and a second cutout in the circuit board. The connector area has a substantially rectangular shape comprising a first side, a second side, a third side and a fourth side. The first side and the second side are substantially in parallel, and the third side and the fourth side are substantially in parallel, wherein the first and the second sides are substantially perpendicular to the third and the fourth sides. The first side of the connector area is aligned to an edge of the circuit board. The first cutout in the circuit board is arranged along the third side of the connector area and the second cutout in the circuit board is arranged along the fourth side of the connector area. Thus, the connector area is connected to a remaining area of the circuit board only along the second side.

The mobile device may be for example a mobile phone, a personal digital assistant, a mobile navigation system, or a mobile computer.

Although specific features described in the above summary and in the following detailed description are described in connection with specific embodiments, it is to be understood that the features of the embodiments described can be combined with each other unless it is noted otherwise.

BRIEF DESCRIPTION OF THE DRAWINGS

Hereinafter, exemplary embodiments of the invention will be described with reference to the drawings.

DETAILED DESCRIPTION OF THE INVENTION

In the following, exemplary embodiments of the present invention will be described in detail. It is to be understood that the following description is given only for the purpose of illustrating the principles of the invention and it is not to be taken in a limiting sense. Rather, the scope of the invention is defined only by the appended claims and is not intended to be limited by the exemplary embodiments hereinafter.

It is to be understood that the features of the various exemplary embodiments described herein may be combined with each other unless specifically noted otherwise. Same reference signs in the various instances of the drawings refer to similar or identical components.

Figure 1:
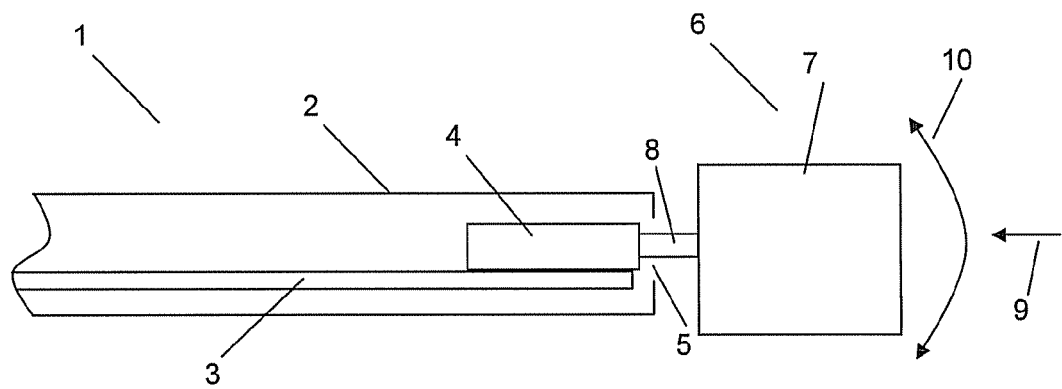
FIG. 1 shows a side-sectional view of a mobile device with a circuit board and a connector.

FIG. 1 shows a side-sectional view of a mobile device 1. The mobile device 1 comprises a housing 2 surrounding a circuit board 3 of the mobile device 1. On the circuit board 3 a connector socket 4, e.g. a USB connector socket, is mounted. The connector socket 4 is mounted to the circuit board via soldering points (not shown). In the housing 2, an opening 5 is provided for accessing the connector socket 4 from an outside of the mobile device 1. As shown in FIG. 1, a connector plug 6 matching to the connector socket 4 comprises a gripping section 7 and a contact section 8. The connector plug 6 can be gripped by a user at the gripping section 7 and brought into contact with the connector socket 4 by inserting the contact section 8 through the opening 5 into the connector socket 4 in the direction of arrow 9. When the connector plug 6 is inserted into the connector socket 4 of the mobile device 1, a force on the connector plug 6 may be applied in the direction of arrow 10 when the mobile device 1 or the connector plug 6 are moved. This force may induce a stress on the soldering points connecting the connector socket 4 and the circuit board 3.

Figure 2:
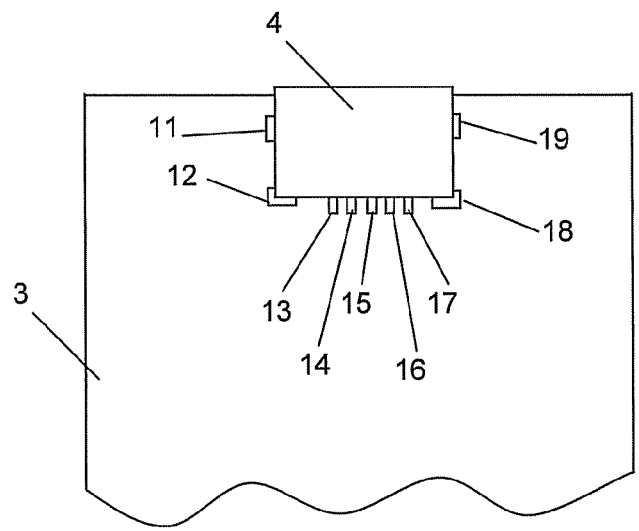
FIG. 2 shows a planview of a circuit board with a connector.
Figure 1A:
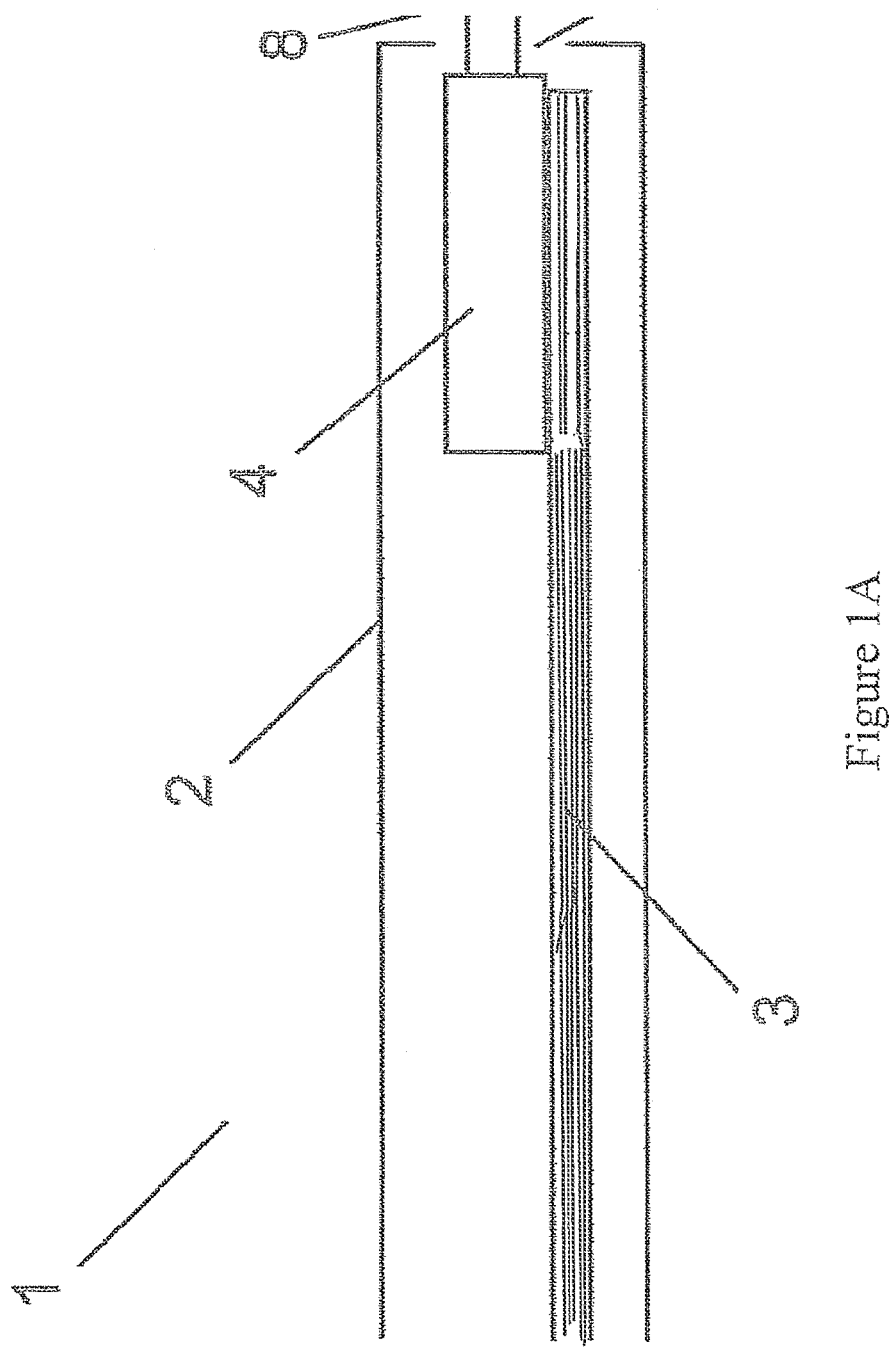

FIG. 2 shows a planview of a conventional circuit board 3 of a mobile device on which a connector 4 is connected via soldering points 11-19 to the circuit board 3. When a force in the direction of arrow 10 (FIG. 1) is applied to the connector 6 and thus to the connector 4, this force is directed to the soldering points 11-19 and finally to the circuit board 3. The force on the soldering points may lead to an injury or breakdown of the connection between the connector 4 and the circuit board 3. This may lead to a malfunction of the connector 4.

Figure 3:
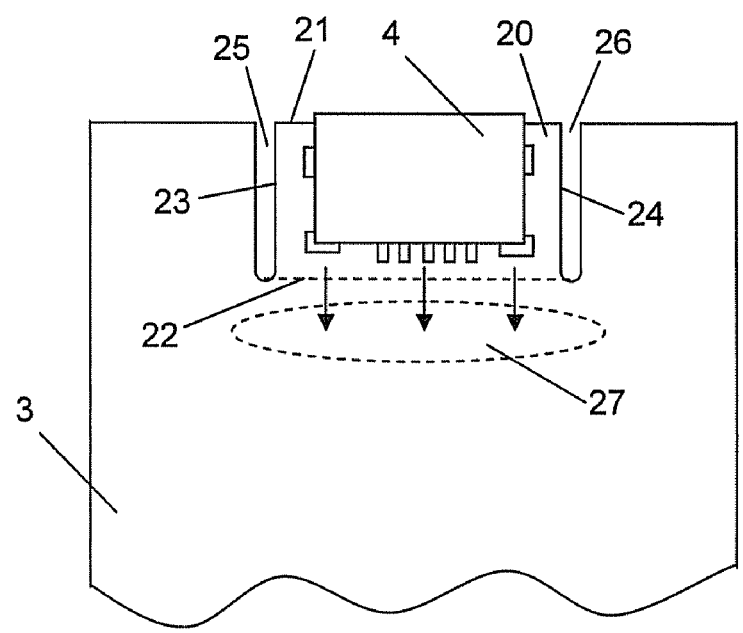
FIG. 3 shows a planview of a circuit board according to an embodiment of the present invention with a connector.

FIG. 3 shows a planview of a circuit board 3 according to an embodiment of the present invention. The circuit board 3 comprises a connector area 20 which has a substantially rectangular shape and is delimited by a first side 21, a second side 22, a third side 23, and a fourth side 24. The first side 21 is aligned to and composed of an edge of the circuit board 3. The second side 22 (indicated by a dashed line) is in parallel to the first side 21. The third side 23 and the fourth side 24 are perpendicular to the first side 21. Two cutouts, a first cutout 25 and a second cutout 26, are provided in the circuit board 3 along the third side 23 and the fourth side 24, respectively. When a force is applied in the direction of arrow 10 in FIG. 1 on the connector 6 and thus on the connector 4 mounted on the connector area 20, the connector area 20 of the circuit board 3 can be easily bent in the direction of arrow 10 with a bending axis along the second side 22. Thus, the stress is moved away from the soldering points 11-19 into an area 27 as indicated by the arrows in FIG. 3. The ability of the circuit board 3 to be easily bent may result from a flexibility of the material the circuit board 3 is made of, e.g. a resin.

Therefore, the risk of a solder break of the soldering points 11-19 can be reduced, when a force is applied in the direction indicated by arrow 10 in FIG. 1.

The circuit board 3 may be a multi-layer circuit board comprising several conductive layers, made e.g. of copper or copper foil, and non-conductive substrate layers, made e.g. of an epoxy material. Within the connector area 20 unnecessary or unused conductive layers are omitted or not present. Therefore, the number of conductive layers in the connector area 20 and in an area near the second side 22 is lower than the number of conductive layers in the remaining area of the circuit board 3. Thus, an elasticity of the circuit board 3 can be increased in the connector area 20, and the risk of a circuit board break can be reduced when a force is applied to the connector 4 or the connector area 20 in the direction of arrow 10.

While exemplary embodiments have been described above, various modifications may be implemented in other embodiments. For example, instead of the connector socket 4, another electromechanical component, e.g. a switch, can be arranged in the same way as the connector 4 on the circuit board 3 to prevent a solder break when a force is applied to the electromechanical component. Furthermore, the structure of the cutouts may be varied. For example, additionally to the cutouts 25, 26 of FIG. 3, some more short cutouts along the second side 22 may be arranged in the circuit board 3 to increase the flexibility of the connector area 20 with respect to the remaining area of the circuit board 3.

Finally, it is to be understood that all the embodiments described above are considered to be comprised by the present invention as it is defined by the appended claims.

What is claimed is:

1. A method for arranging a component on a circuit board, the method comprising:
    providing at least one cutout in the circuit board such that a component area of the circuit board is physically separated from a remaining area of the circuit board except along either
        one straight borderline delimiting the component area from the remaining area of the circuit board, or
        several straight borderlines delimiting the component area from the remaining area of the circuit board, the several straight borderlines being arranged on a common straight line, and
    mounting the component on the component area of the circuit board such that the component is placed on the component area, wherein the component area has substantially the same size as a footprint of the component, and wherein the circuit board comprises a multi-layer circuit board comprising several conductive layers and non-conductive substrate layers, the number of conductive layers in the component area being lower than the number of conductive layers in the remaining area.

2. The method according to claim 1, wherein the component area has a slightly larger size than a footprint of the component.

3. The method according to claim 1, wherein the component comprises an electromechanical component selected from the group comprising a connector, a switch, a connector plug, and a connector socket.

4. The method according to claim 1, wherein the component comprises an USB connector.

5. The method according to claim 1, wherein the circuit board comprises a circuit board of a mobile device, wherein the component is mechanically accessible from an outside of the mobile device.

6. A circuit board, comprising:
    a component area on which a component is to be mounted, and
    at least one cutout in the circuit board such that the component area of the circuit board is physically separated from a remaining area of the circuit board except along either
        one straight borderline delimiting the component area from the remaining area of the circuit board, or
        several straight borderlines delimiting the component area from the remaining area of the circuit board, the several borderlines being arranged on a common straight line, wherein the component area has substantially the same size as a footprint of the component,
    and wherein the circuit board comprises a multi-layer circuit board comprising several conductive layers and non-conductive substrate layers, the number of conductive layers in the component area being lower than the number of conductive layers in the remaining area.

7. The circuit board according to claim 6, wherein the component area has a slightly larger size than a footprint of the component.

8. The circuit board according to claim 6, wherein the component comprises an electromechanical component selected from the group comprising a connector, a switch, a connector plug, and a connector socket.

9. The circuit board according to claim 6, wherein the component comprises an USB connector.

10. The circuit board according to claim 6, wherein the circuit board comprises a circuit board of a mobile device, wherein the component is mechanically accessible from an outside of the mobile device.

11. A circuit board, comprising:
    a connector area on which a connector is to be mounted, the connector area having a substantially rectangular shape with a first side and a second side being substantially in parallel, and a third side and a fourth side being substantially in parallel, the first and the second sides being substantially perpendicular to the third and the fourth sides, the first side of the connector area being aligned to an edge of the circuit board,
    a first cutout in the circuit board along the third side of the connector area, and
    a second cutout in the circuit board along the fourth side of the connector area, wherein the connector area is connected to a remaining area of the circuit board only along the second side, and wherein the connector area has substantially the same size as a footprint of the connector to be mounted thereon,
    and wherein the circuit board comprises a multi-layer circuit board comprising several conductive layers and non-conductive substrate layers, the number of conductive layers in the component area being lower than the number of conductive layers in the remaining area.

12. The circuit board according to claim 11, wherein the circuit board comprises a circuit board of a mobile device, wherein the connector is mechanically accessible from an outside of the mobile device, an access opening of the connector being arranged at the first side.

13. A mobile device comprising a circuit board, the circuit board comprising:
    a component area on which a component is to be mounted, and
    at least one cutout in the circuit board such that the component area of the circuit board is physically separated from a remaining area of the circuit board except along either
        one straight borderline delimiting the component area and the remaining area of the circuit board, or
        several straight borderlines delimiting the component area and the remaining area of the circuit board, the several borderlines being arranged on a common straight line, wherein the component area has substantially the same size as a footprint of the component,
    and wherein the circuit board comprises a multi-layer circuit board comprising several conductive layers and non-conductive substrate layers, the number of conductive layers in the component area being lower than the number of conductive layers in the remaining area.

14. The mobile device according to claim 13, wherein the mobile device comprises a device selected from the group comprising a mobile phone, a personal digital assistant, a mobile navigation system, and a mobile computer.

15. A mobile device comprising a circuit board, the circuit board comprising:
- a connector area on which a connector is to be mounted, the connector area having a substantially rectangular shape with a first side and a second side being substantially in parallel, and a third side and a fourth side being substantially in parallel, the first and the second sides being substantially perpendicular to the third and the fourth sides, the first side of the connector area being aligned to an edge of the circuit board,
- a first cutout in the circuit board along the third side of the connector area, and
- a second cutout in the circuit board along the fourth side of the connector area, wherein the connector area is connected to a remaining area of the circuit board only along the second side, and wherein the connector area has substantially the same size as a footprint of the connector to be mounted thereon,
- and wherein the circuit board comprises a multi-layer circuit board comprising several conductive layers and non-conductive substrate layers, the number of conductive layers in the component area being lower than the number of conductive layers in the remaining area.

16. The mobile device according to claim 15, wherein the mobile device comprises a device selected from the group comprising a mobile phone, a personal digital assistant, a mobile navigation system, and a mobile computer.

* * * * *